Nov. 28, 1961 L. A. BUSBY 3,011,052
TRANSISTOR SQUELCH CIRCUIT
Filed Sept. 15, 1958
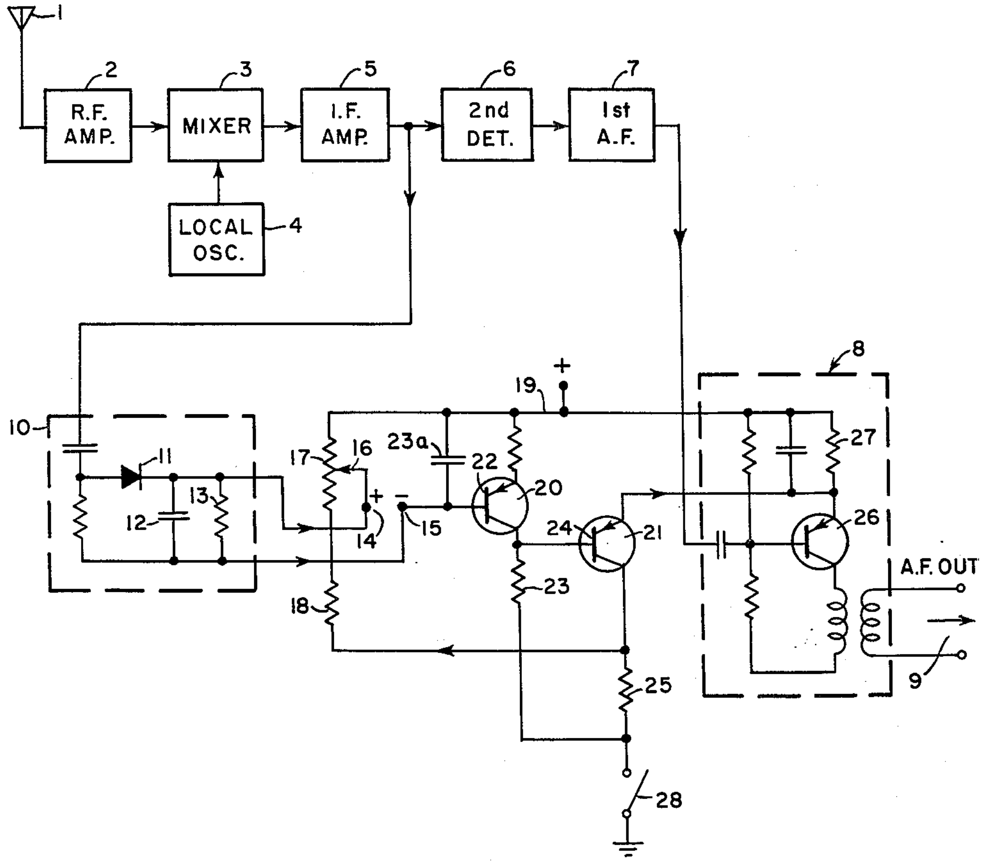
INVENTOR.
LAWRENCE A. BUSBY
BY T. L. Styner
ATTORNEY

United States Patent Office 3,011,052
Patented Nov. 28, 1961

3,011,052

TRANSISTOR SQUELCH CIRCUIT

Lawrence A. Busby, Pittsford, N.Y., assignor to General Dynamics Corporation, Rochester, N.Y., a corporation of Delaware Filed Sept. 15, 1958, Ser. No. 761,195
3 Claims. (Cl. 250—20)

This invention relates to squelch circuits and is particularly directed to means for improving the sensitivity of squelch circuits.

Although the squelch circuit contemplated is uniquely adapted to radio receivers, the squelch circuit of this invention can be employed in many places where a secondary circuit must be switched on and off in response to the change of a control voltage, in a primary circuit, across a predetermined and adjustable threshold value.

Where vacuum tubes are employed in the control circuit of a squelch system, the high impedance of the tubes enables the sensitivity of the circuits to be increased to a point where minute D.C. increments of voltage will operate the squelch circuit. Where transistors must be used, however, we find the undesirable situation of a high impedance signal source working into the low impedance of the transistor control circuit. Transistors thus used cause trouble because of a large change in input impedance when the transistor changes from the conducting to the non-conducting state or vice versa. This change in input impedance of a transistor causes a variance in the load on the source such that the source output voltage is changed. This voltage change resulting from changes in loading is delayed by the capacity effects in the circuitry and thus, as the sensitivity of such a control circuit is increased by reducing the required "on-off" voltage increment, a point is reached where the circuit generates self-sustained oscillations.

An object of this invention is to provide an improved squelch circuit.

A more specific object of this invention is to provide a squelch circuit which is capable of extreme sensitivity and will not oscillate, nor multivibrate, even though the squelch circuit control is of low impedance and is driven by a high impedance signal source.

The objects of this invention are attained by cascading two transistors and coupling the input of the first transistor to the control circuit and coupling the output of the second transistor into the circuit to be switched, and regeneratively feeding back D.C. voltage changes from the output to the input circuit to assist, or "push," the changes in the control electrode voltage as that voltage moves across the "on-off" threshold value.

Other objects and features of this invention will become apparent to those skilled in the art by referring to the embodiments described in the following specification and shown in the accompanying drawing in which the single figure shows schematically one such embodiment.

A radio receiver is illustrated in the drawing into which the squelch circuit of this invention is incorporated. The receiver comprises the antenna 1 coupled to the radio frequency amplifier 2 and, hence, to the mixer 3 in which the modulated carrier wave is combined with the output of the local oscillator 4. One of the resulting intermediate frequencies is amplified at 5, and the desired signal is detected at 6. The desired signal is, typically, an audio frequency and is amplified at 7 and 8 before the signal is passed to the AF output 9. The squelch circuit is for the simple purpose of quieting the amplifier 8 when the carrier voltage drops below a usable level as when the signal-to-noise ratio deteriorates to the point where a useful signal cannot be heard.

In the specific example illustrated, the carrier is sampled by connecting a carrier detector 10 to the output of the intermediate frequency amplifier 5. Amplifier 5 is capacitively coupled as shown to the rectifier 11 and the filter elements 12 and 13 are provided for producing a steady direct current at terminals 14 and 15 which voltage is representative of the received carrier voltage. The rectifier is so polarized, in the example shown, that terminal 15 is negative and rises or falls in potential with respect to terminal 14, when the carrier rises and falls, respectively.

The threshold voltage level at which the squelch circuit will operate is manually adjusted by slider 16 on potentiometer 17. Potentiometer 17, connected in series with resistor 18 and resistor 25, is connected between the power supply bus 19 and ground, the bus in the example being held at a positive potential with respect to ground. As slider 16 is moved along the potentiometer, the required voltage at terminals 14 and 15 to operate the squelch circuit will change.

The squelch circuit shown comprises the two cascaded transistors 20 and 21 each of the P-N-P type. The base 22 controls the emitter-to-collector current of transistor 20 and, hence, controls the current through the load resistor 23. The drop across the load resistor 23 is applied to the base 24 of transistor 21, and accordingly controls the emitter-to-collector current through transistor 21 and through the collector-resistor 25. The emitter of 21 is connected directly to the emitter of the output or power transistor 26 of AF amplifier stage 8. When transistor 21 conducts, transistor 26 is cut off by virtue of the drop across common emitter resistor 27, and the output 9 is quieted.

It is important to prevent noise or signal modulations of any kind being applied to the base 22 so that carrier level only is effective in squelching. To this end, a relatively large condenser *23a* is connected from the base 22 to some point of steady voltage.

According to an important and characteristic feature of this invention, a voltage generated at the output of transistor 21 is fed back to the input of transistor 20. In the example shown, the output voltage developed at the collector end of resistor 25 is applied to the lower end of the voltage divider 17—18. It will be perceived that the connections are so polarized that an incremental change in a negative direction, say, of base 22 is followed without delay by a corresponding but amplified voltage change in a negative direction at the collector of 21, and hence by an assisted change in a negative direction of the base 22. Conversely, if base 22 receives an incremental change in voltage in a positive direction, a positive voltage feedback change is applied to the lower end of the voltage divider 17—18 and the base 22 swings substantially in a positive direction. Accordingly, the squelch circuit operates between "on" and "off" states in either direction regardless of the smallness of the incremental change necessary to initiate the change, and regardless of the size of condenser 12 or other factors which might delay the change. Further, the static bias on base 22 can be selected well removed from the cutoff bias for transistor 20, and hence prevent the large input impedance changes so characteristic of the transistor when it is biased into or out of cutoff condition. Negligible load change on the carrier detector circuits is the result desired.

By employing transistors of the P-N-P type, a single, positive-voltage bus is required. If N-P-N type transistors are substituted, it would be necessary merely to reverse the polarity of bus 19 and reverse terminals 14 and 15. The squelch action in either case is effectively disabled by opening the normally closed ground switch 28.

Many modifications may be made in the details of the illustrated embodiment without departing from the spirit of the invention as defined in the appended claims.

What is claimed is:

1. A trigger circuit for producing a positive on-and-off action in response to a predetermined incremental change in a controlling voltage, said trigger circuit comprising a first and a second transistor, each transistor having a emitter, base and collector, the emitter-collector circuit of said first and second transistor being connected across a power supply, the base of said second transistor being coupled directly to one of the output electrodes of the first transistor, a resistor connected at one end directly to the collector of said second transistor, a voltage divider including a potentiometer resistance connected in series with said resistor, said voltage divider being connected across said power supply, a source of controlling voltage being connected between the sliding contact of said potentiometer and the base of said first transistor; and the output circuit of said second transistor being connected to the utilization circuit to be turned on and off.

2. A trigger circuit for producing on-and-off action in response to incremental changes in a controlling voltage across a predetermined threshold value, a first and second transistor, each transistor having input and output electrodes, said transistor being connected in cascade between the controlling voltage source and the device to be controlled, a source of manually adjustable voltage, the source of controlling voltage being connected between said adjustable source and the input electrode of said first transistor, and a regenerative feedback circuit connected between the output electrode of said second transistor and said adjustable voltage source for regeneratively assisting said incremental changes in controlling voltage.

3. A circuit for squelching an audio amplifier of a radio receiver in response to the reduction of a carrier voltage below a predetermined level comprising a carrier level detector coupled to said receiver and a controlled circuit connected to an audio amplifier of said receiver for selectively squelching said audio amplifier; two cascaded transistors coupled between said carrier detector and said audio amplifier, a manually adjustable voltage source, said carrier detector output being connected between said adjustable voltage source and the first of said cascaded transistors, and a feedback circuit from the output of the last of said transistors to said adjustable source for regeneratively assisting incremental carrier voltage changes applied to said transistor from said carrier detector and for reducing the effects of load changes on said carrier detector by said first transistor.

References Cited in the file of this patent

UNITED STATES PATENTS

| | | |
|---|---|---|
| 2,479,305 | Brown | Aug. 16, 1949 |
| 2,629,026 | Kilgore | Feb. 17, 1953 |
| 2,788,449 | Bright | Apr. 9, 1957 |
| 2,802,939 | Klehfoth | Aug. 13, 1957 |
| 2,830,177 | Taylor | Apr. 8, 1958 |
| 2,861,258 | Walsh et al. | Nov. 18, 1958 |
| 2,912,490 | Parker | Nov. 10, 1959 |
| 2,915,603 | Jacobsen | Dec. 1, 1959 |
| 2,926,241 | Goldman | Feb. 23, 1960 |